US008513860B2

(12) United States Patent
Paget

(10) Patent No.: US 8,513,860 B2
(45) Date of Patent: Aug. 20, 2013

(54) ACOUSTIC MONITORING SYSTEM

(75) Inventor: Christophe Paget, Bristol (GB)

(73) Assignee: Airbus Operations Limited, Bristol (GB)

( * ) Notice: Subject to any disclaimer, the term of this patent is extended or adjusted under 35 U.S.C. 154(b) by 428 days.

(21) Appl. No.: 12/745,910

(22) PCT Filed: Nov. 26, 2008

(86) PCT No.: PCT/GB2008/051120
§ 371 (c)(1), (2), (4) Date: Jun. 3, 2010

(87) PCT Pub. No.: WO2009/071934
PCT Pub. Date: Jun. 11, 2009

(65) Prior Publication Data

US 2010/0264778 A1 Oct. 21, 2010

(30) Foreign Application Priority Data

Dec. 3, 2007 (GB) .................................. 0723526.0

(51) Int. Cl.
*H01L 41/08* (2006.01)

(52) U.S. Cl.
USPC ............................ 310/336; 310/328; 310/365

(58) Field of Classification Search
USPC .................................. 310/322, 336, 338, 365
See application file for complete search history.

(56) References Cited

U.S. PATENT DOCUMENTS

| | | | | |
|---|---|---|---|---|
| 3,090,030 | A | 5/1963 | Schuck | |
| 3,457,543 | A | 7/1969 | Akervold et al. | |
| 4,129,799 | A * | 12/1978 | Green | 310/359 |
| 4,344,159 | A * | 8/1982 | Ballinger | 367/87 |
| 4,586,512 | A * | 5/1986 | Do-huu et al. | 600/447 |
| 5,991,239 | A | 11/1999 | Fatemi-Booshehri et al. | |
| 6,420,816 | B2 | 7/2002 | Getman et al. | |
| 6,984,923 | B1 * | 1/2006 | Walsh et al. | 310/334 |
| 7,293,461 | B1 * | 11/2007 | Girndt | 73/622 |
| 7,325,456 | B2 * | 2/2008 | Kim | 73/587 |
| 7,800,284 | B2 * | 9/2010 | Theuerkauf | 310/337 |
| 7,936,110 | B2 * | 5/2011 | Andle et al. | 310/333 |
| 8,102,101 | B2 * | 1/2012 | Giurgiutiu et al. | 310/365 |
| 8,286,467 | B2 * | 10/2012 | Fatemi et al. | 73/105 |

FOREIGN PATENT DOCUMENTS

| | | | |
|---|---|---|---|
| CA | 2268415 | A | 10/2000 |
| EP | 1821406 | A2 | 8/2007 |
| EP | 1947765 | A1 | 7/2008 |
| GB | 2230159 | A | 10/1990 |

OTHER PUBLICATIONS

British Search Report for GB0723526.0 dated Feb. 12, 2008.
ISR for PCT/GB2008/051120 dated Mar. 19, 2009.

* cited by examiner

*Primary Examiner* — Jaydi San Martin
(74) *Attorney, Agent, or Firm* — Lowe Hauptman Ham & Berner, LLP

(57) ABSTRACT

An acoustic transducer is disclosed in which a set of electrode arrays is arranged around a nominal center point and comprising a set of circumferentially disposed electrode elements. A piezoelectric material is located between a common electrode and said electrode elements.

14 Claims, 5 Drawing Sheets

ACOUSTIC MONITORING SYSTEM

RELATED APPLICATIONS

The present application is national phase of International Application Number PCT/GB2008/051120, filed on Nov. 26, 2008, and claims priority from British Application Number GB0723526.0, filed on Dec. 3, 2007, the disclosures of which are incorporated herein in their entirety.

FIELD OF INVENTION

The present invention relates to an acoustic transducer.

BACKGROUND OF THE INVENTION

Any structure may suffer damage during its use that may lead to the eventual failure of the structure. In many scenarios, it is important to monitor damage so that the damage can be repaired or the structure can be replaced before any degradation of performance occurs. Many such structures are built and used in the aeronautical, aerospace, maritime, or automotive industries.

When damage occurs within a structure, the damaged area emits an acoustic emission (AE) that propagates through the material of the structure. Acoustic damage monitoring systems, in the form of acoustic emission detection and monitoring systems, are arranged to detect the acoustic emission made as damage occurs to a structure. Such systems are used in Non Destructive Testing (NDT) systems such as Structural Health Monitoring (SHM) systems. In such systems, sensors attached at known locations in the structure detect the acoustic emissions. The time of flight (ToF) of the acoustic emission to each sensor is recorded. The location of the AE can then be determined using triangulation of the ToFs for a given AE from the known locations for the receiving sensors. Such techniques of detecting AEs are referred to as passive acoustic monitoring systems. Another type of acoustic monitoring system is referred to as an active system. In such active systems, a transducer attached to a given structure generates an interrogating acoustic signal and any received echo analysed to identify and quantify defects or damage.

In mechanical structures, such as aircraft sections or components, which are predominantly constructed of plates, the acoustic waves form particular types of plate waves known as Lamb waves. In passive systems the acoustic waves are emitted by damage as it occurs while in active systems the acoustic waves are emitted or generated by a transducer. Lamb waves have a number of different oscillatory patterns or modes that are capable of maintaining their shape and propagating in a stable or unstable manner depending on their dispersivity state. Changes in the mechanical form of a structure, such as a boundary between one material and another or changes in cross sectional thickness of a given material, can affect the Lamb wave signal. For example, a material joint may delay a Lamb wave signal, reduce its amplitude or change its mode. Different wave modes may be affected differently by such structural variations. For example, one Lamb wave mode may be attenuated differently to another mode by a given structural variation along the wave path. Indeed the attenuation of some modes may be so great that the given mode fails to reach a given sensor location with a detectable amplitude. Lamb waves propagate in all directions but are sensitive to the directional stiffness and thickness of the structure in which they travel. Thus, a given structure may facilitate propagation of Lamb waves in a particular direction. The stiffness and thickness may result from features within the structure.

Each Lamb wave mode commonly has a signature frequency and wavelength band. All modes may not reach the point at which a sensor for a passive or active monitoring system is located. Thus one problem is matching the frequency of a Lamb wave generating or sensing transducers located at a given point to the frequency bands likely to be detected at that point.

SUMMARY OF THE INVENTION

An embodiment of the invention provides an acoustic transducer comprising:

a piezoelectric substrate having a first and second opposing sides;

a common electrode disposed on the first side of the substrate;

a plurality of first electrode arrays disposed on the second side of the substrate, each first electrode array comprising a plurality of electrode elements circumferentially disposed and radially spaced relative to a nominal centre point and arranged to enable one or more groups of the electrode elements to be selected from a given first electrode array so as to tune the first electrode array to a predetermined frequency band, and each first electrode array being arranged in a predetermined radial direction relative to the nominal centre point so as to tune each first electrode array to signals having a corresponding directionality.

The first electrode arrays may be arranged to enable one or more groups of the electrode elements to be selected from a given first electrode array so as to tune the given first electrode array to a predetermined frequency band and to determine the position of the groups relative to the nominal centre point. The electrode elements for one or more of the first electrode arrays may be arranged with a common circumferential dimension. The electrode elements for one or more of the first electrode arrays may be arranged with a circumferential dimension proportional to the distance of a given electrode element from the nominal centre point.

The transducer may further comprise a circumferentially disposed second array of radially disposed electrode elements. The transducer may further comprise a third array centred on the nominal centre point. The third array may comprise one or more radially spaced concentric elements. The transducer may be arranged to operate at a frequency range of 10 kHz to 20 Mhz. The transducer may be arranged for use with guided Lamb waves. Each electrode element may be wired to processor for processing signal received by the transducer.

BRIEF DESCRIPTION OF THE DRAWINGS

Embodiments of the invention will now be described, by way of example only, with reference to the accompanying drawings in which.

DETAILED DESCRIPTION OF PREFERRED EMBODIMENTS OF THE INVENTION

Figure 1:
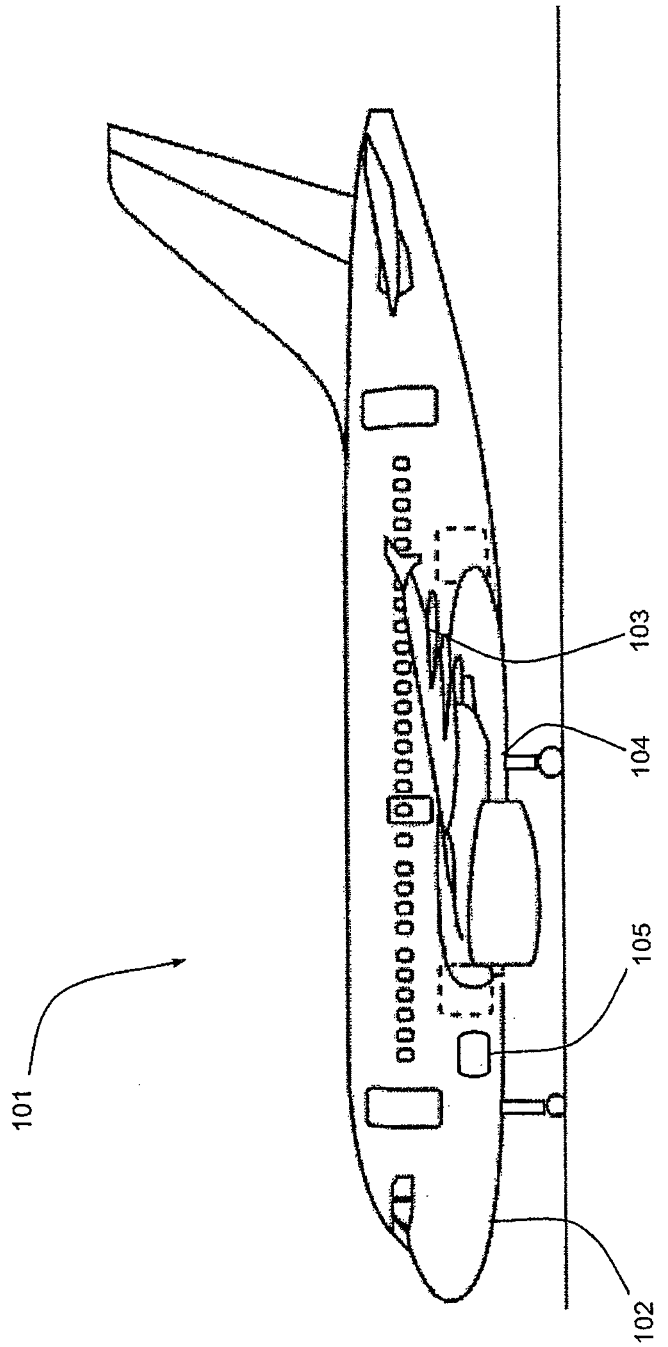
FIG. 1 is a side view of an aircraft on the ground.
Figure 2:
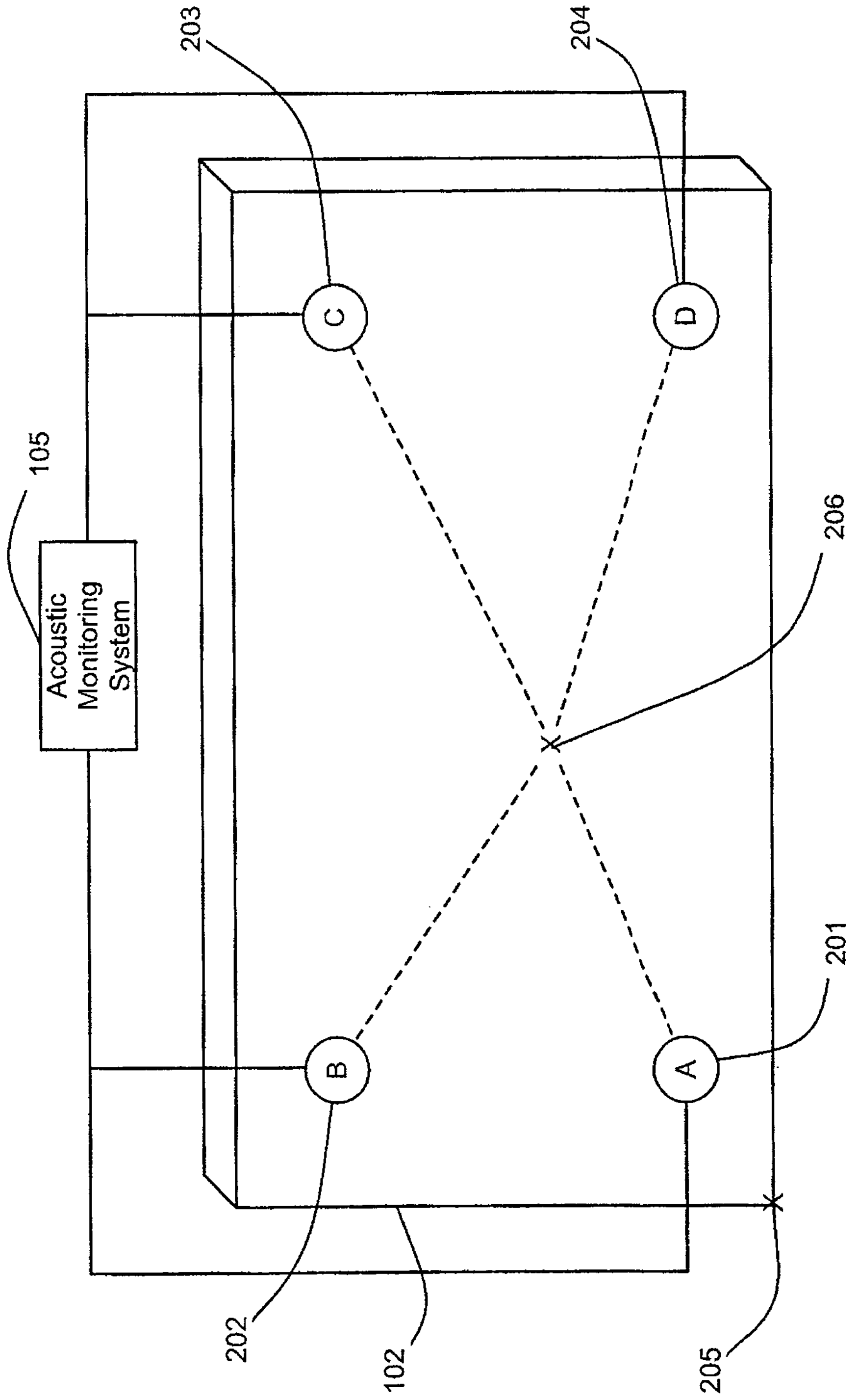
FIG. 2 is a schematic illustration of an acoustic monitoring system in the aircraft of FIG. 1.

With reference to FIG. 1, an aircraft 101 comprises a fuselage 102 and a set of wings 103 faired into the fuselage 102 via fairings 104. The aircraft 101 further comprises a passive acoustic monitoring system 105 arranged to detect acoustic emissions caused by damage to the structure of the aircraft 101, via a set of transducers in the form of acoustic emission sensors (not shown in FIG. 1) attached to the structure of the aircraft 101. The transducers are arranged to detect propagating Lamb waves emitted when damage occurs to the aircraft structure so as to enable the identification of the area of the aircraft structure that requires inspection or repair. FIG. 2 shows a section of the fuselage 102 in which the transducers, in the form of sensors 201, 202, 203, 204, are attached in a grid pattern at known locations from a reference point 205. Each sensor 201, 202, 203, 204 is connected to the acoustic monitoring system 105.

If damage occurs, for example at a site 206 in the fuselage, an acoustic emission is emitted from the site 206 and propagates though the fuselage towards the sensors 201, 202, 203, 204. As a result of the differing path length between the AE and sensors, and possible different group velocities, the acoustic emission will be detected at each of the sensors 201, 202, 203, 204, at different times. In the example of FIG. 2, the acoustic emission is detected by sensor A 201 first, followed by the sensor B 202, sensor C 203 and then sensor D 204. The acoustic monitoring system 105 is arranged to record a set of times of flight (ToFs) for the acoustic emission as a set of relative time measurements, that is, as time measurements relative to the first detection of the acoustic emission by any one of the sensors 201, 202, 203, 204. In other words, the relative time for sensor A is zero and the relative time for the other sensors B, C, D is time difference between the detection of the acoustic emission at sensor A and its subsequent reception at the other sensors B, C, D. The ToF differences are then triangulated to determine the location of the AE.

As noted above, different wave modes of a Lamb wave may be affected differently by structural variations. For example, one wave mode may be attenuated differently to another mode by a given structural variation along the wave path. The effect of such structural variation on an acoustic emission can be calculated using known experimental or empirical attenuation data and theoretical dispersion data for the relevant materials represented by dispersion functions or curves. Such dispersion curves detail available wave modes and their velocities and wavelength (sensitivity) and are used to determine the wave modes that should be detectable at a given point. In the present embodiment, dispersion curves are used to select the frequency detection characteristics for each of the sensors 201, 202, 203, 204. In other words the dispersion curves are used to determine which particular wave modes have the largest amplitudes at a given location to enable the sensors 201, 202, 203, 204 at those locations to be tuned to the correct detection frequency to detect those particular wave modes. The dispersion curves also provide the group and phase velocities of each mode, along with an indication of Lamb wave sensitivity to a damage size. The dispersion curves may be determined analytically or experimentally.

Figure 3:
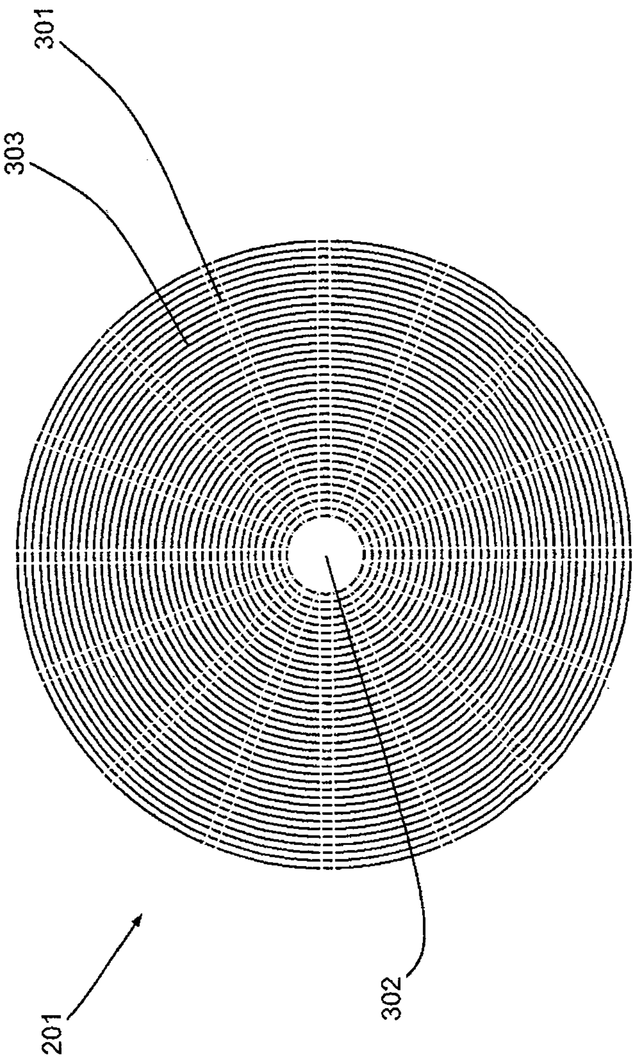
FIG. 3 is a plan view of the transducer of FIG. 2.

With reference to FIG. 3, each sensor 201 is substantially circular in plan and comprises a set of sixteen first electrode arrays 301 arranged around the nominal centre point of the sensor. Each first electrode array 301 is uniformly radially disposed about the nominal centre point 302 and comprises a set of circumferentially disposed electrode elements each having a common radial dimension. In other words, each of the first electrode arrays comprises a band of evenly spaced electrode elements. In the present embodiment, the sensor 201 further comprises a further set of sixteen, second electrode arrays 303 uniformly radially disposed about the nominal centre point 302 and interposed between respective first electrode arrays 301. Each second electrode array 303 comprises a set of second circumferentially disposed electrode elements having a radial dimension directly proportional to the radial spacing of a given electrode element from the nominal centre point of the sensor. In the present embodiment, each of the first and second arrays 301, 303 comprise thirty six elements. Each of the first and second electrode arrays provide directional detection of AEs. Thus, signals from only two sensors are required to triangulate the location 206 of the source of the AE.

Figure 4:
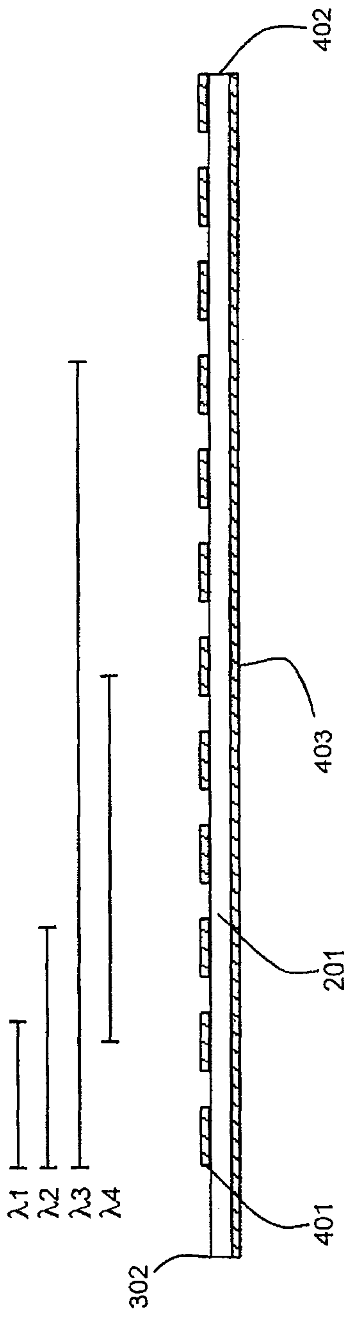
FIG. 4 is a cross sectional view of a transducer used in the acoustic monitoring system of FIG. 2.

FIG. 4 shows a partial cross section of the sensor 201 from the centre point 302 through twelve of the electrode elements of one of the first electrode arrays 301. The electrode elements 401 of the first electrode array 301 are arranged on one face of a planar piezoelectric substrate, in the form of a lead zirconate titanate (PZT) wafer 402. A common electrode 403 is disposed on the opposite face of the wafer 402 to the face on which the first and second sets of electrode arrays 301, 303 are disposed. The electrodes 301, 303 and 403 are all wired to the acoustic monitoring system 105 where analysis of the received signals is performed. When the sensor 201 is attached to a surface, mechanical waves in the surface stimulate the PZT wafer 402. Such stimulations are proportionally converted into electrical potential in the wafer 402, which is then detected by the acoustic monitoring system 105 via the electrode arrays 301, 303 and common electrode 403. The electrical potential detected by each electrode element 401 is dependent on the radial width of a given electrode element 401, the thickness of the PZT wafer 402 and amplitude and frequency of a given AE at the location of the given electrode element 401.

As noted above, Lamb waves comprise a set of wave modes, with each having a signature frequency or wavelength band and propagation speed. The arrangement of the array elements 401 in the electrode array 301 enables the selective tuning of the array to a given wavelength. In other words, appropriate array elements 401 are selected from the electrode array 301 so as to provide a narrowband transducer having an operational frequency and wavelength matched to that of the wave mode to be detected, thus reducing the detection of unwanted wave modes. For example, with reference to FIG. 4, selecting the first and second electrode elements from the left as shown in FIG. 4 will tune the electrode array 301 to detect a predetermined wavelength λ1 defined by the following equation:

$$\lambda 1 = n \cdot \lambda X$$

Where λ1 is proportional to a Lamb wave mode X wavelength (λX), by a factor n where n is an integer. In addition, the wavelength λ1 may be simultaneously selected to tune the electrode array 301 to exclude a predetermined Lamb wave mode Y as defined by the following equation:

$$\lambda 1 = (m/h) \cdot \lambda Y$$

Where λ1 is proportional to the excluded Lamb wave mode Y wavelength (λY), by a factor m/h, where m is an integer and h is a variable with an optimal value of 2. Where λ1 is selected such that h=2, the mode Y will be completely excluded from detection. The greater the difference of the value of h from its optimal value of two, then the greater the proportion of the amplitude of mode Y that will be detected.

For example, given two Lamb wave modes X and Y with wavelengths of 3 mm and 42 mm, respectively. To remove mode Y, a distance between two electrode elements of λ1=21 mm is selected which is 7 times the wavelength of mode X and half the wavelength of mode Y. In other words, n=7, m=1 and h=2. If a distance between two electrode elements of λ1=63 mm is selected the same result would be achieved, if the Lamb wave mode attenuation is discarded. In a further example, given two modes X and Y with respective wavelengths of 4 mm and 22.5 mm, then selecting a distance between two (or more) electrode elements of λ1=12 mm would be 3 times λX and approximately ½·λY. In other words, n=3, m=1 and h=1.875. Thus only mode X will be received and mode Y would be mostly excluded, however not completely since h is not equal to 2. Alternatively, an electrode element length of λ1=22.5 mm would be 15·½·λX (n not an integer) and 1·λY (m=2 and h=2), thus tuning the sensor to detect mode Y and exclude mode X. In other words, the physical extent of the combination of the first or second electrode array elements is arranged to match or approximate to the wavelength λ1. Similarly, selecting the first to third or first to ninth electrode elements 401 from the left will result in the tuning of the electrode array to receive wavelengths λ2 and λ3 as shown in FIG. 4.

Spaced groups of elements may be selected, with the wavelength corresponding to the distance between the centres of each such selected group. For example, selecting the first, second and third electrode elements from the left for one group and the fifth, sixth and seventh electrode elements from the left as the second group would result in an electrode array tuned to a wavelength λ4. The wavelength λ4 corresponds to the physical distance between the centres of the two selected groups of electrode elements. Thus, using the relevant dispersion curve for the material to which the sensor 201 is attached, the relevant modes for a given point of attachment may be determined and the sensor 201 tuned accordingly. Details of determining dispersion curves in composite material are described in "Design of optimal configuration for generating A0 Lamb mode in a composite plate using piezoceramic transducers" by Sebastien Grondel, Christophe Paget, Christophe Delebarre and Jamal Assaad, Journal of the Acoustical Society of America, 112 (1), July 2002. In the present embodiment, the tuning is performed by the acoustic monitoring system 105 by appropriate selection and processing of signals from the electrode elements 401 of the sensor 201.

As will be understood by those skilled in the art, any set of groups of electrode elements 401 may be selected when tuning the electrode array 301. For example the fifth to the twentieth electrode elements may be used for a given wavelength thus enabling the reception of Lamb waves to be shifted relative to the centre point 302. Having sixteen radially spaced electrode arrays 301 in the present embodiment enables directional tuning of the sensor, with each electrode array 301 being tuned to a predetermined frequency or wavelength. Directional Lamb wave detection enables the sensor to be focussed on a potential damage source or used in conjunction with one or more other similar sensors to triangulate the position of the source of the AE.

In the present embodiment, the second electrode arrays 303 are arranged to be tuned in the same manner as the first electrode arrays 301. Each of the first electrode arrays 301, having uniform width electrode elements 401, is focussed in a specific single direction with a narrow detection field. Each second electrode array 303, having electrode elements with radially increasing width, is less focussed, having a diverging detection field. A diverging detection field provides more complex, yet richer data for analysis. In order words, the second electrode array 303 may provide a greater range of AE detection, potentially providing a more accurate damage location data.

In a further embodiment, the sensor 201 of FIG. 3 is employed in an active acoustic monitoring system in the form of an acoustic inspection system in which the first electrode array 301 is used to generate guided Lamb waves of a frequency that is selected as described above. The direction of the generated waves may also be selected by powering one or more suitably orientated first electrode arrays 301. The second electrode arrays 303 are then used to detect echoes or reflections of the generated Lamb waves caused by damage sites.

Figure 5:
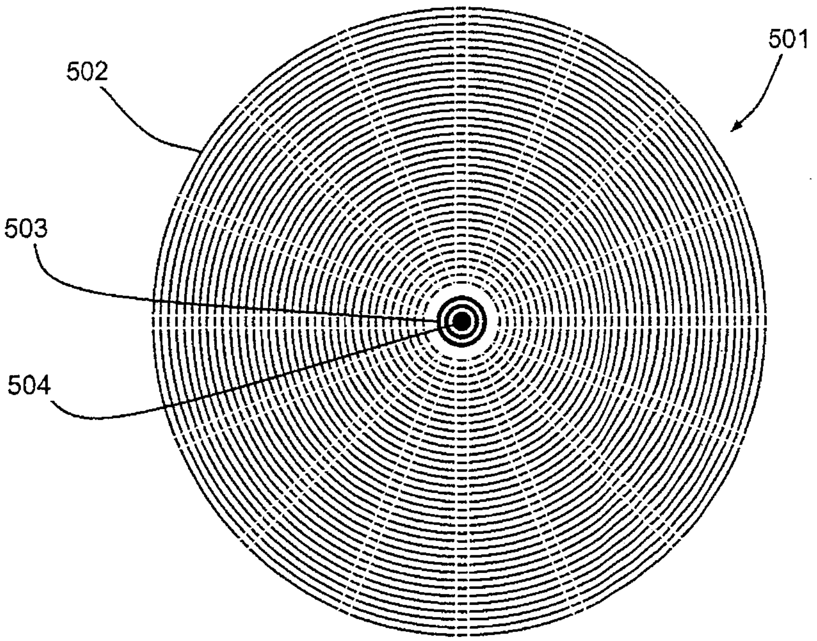
FIGS. 5 and 6 are plan views of transducers arranged in accordance with other embodiments.

In another embodiment as shown in FIG. 5, the transducer 501 further comprises a central third electrode array 502 located on the centre point 503 of the transducer 501. The third electrode array 502 comprises two concentric ring electrode elements centred on a central disc electrode element. The concentric rings are selectable to enable the third electrode array 502 to be utilised as a multiple narrow band transducer. The resonant frequency of the third electrode array 503 is governed by the overall diameter the selected group of ring electrode elements. The third electrode array 503 is powered with a suitable signal windowed typically by Hanning or Hamming filter so as to emit Lamb waves. The third electrode array 503 may be used to generate guided Lamb wave to enable the transducer 501 to be used as a pulse/echo transducer for use in an acoustic inspection system. Such acoustic inspection systems employ non-destructive testing techniques for damage detection in complex assemblies such as aircraft structures.

Figure 6:
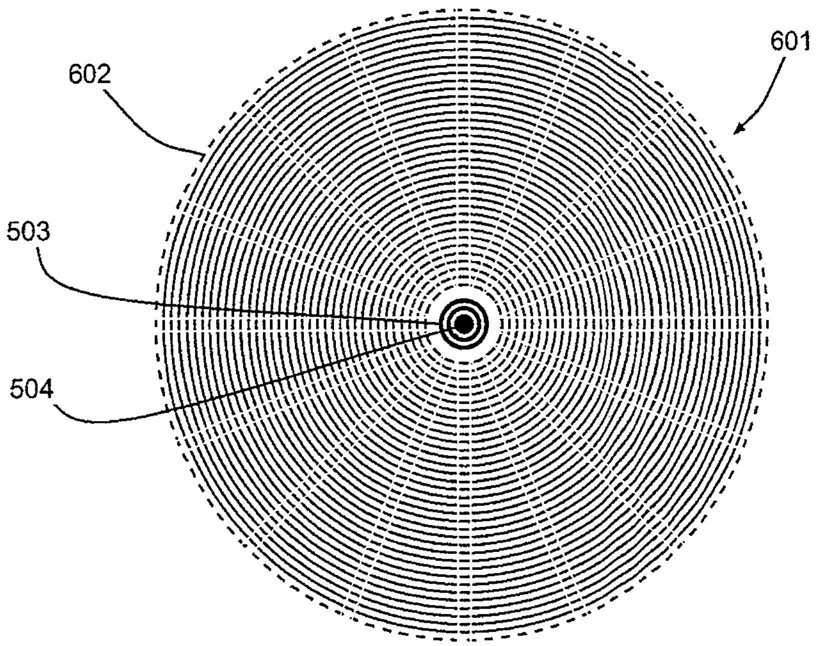

In another embodiment as shown in FIG. 6, a sensor 601 further comprises a fourth electrode array 602 made up of radially disposed electrode elements. The fourth electrode array is provided with 180 electrode elements each arranged to detect elements of the signal emitted from the third electrode array 503 reflected by an area of damage in the structure being monitored. The radial location of the electrode element at which a reflected signal is detected indicates the direction of the damage location relative to that of the sensor 601. Thus the sensor 601 is suitable for use in both active and passive acoustic monitoring systems for providing directional signal source location.

In another embodiment, the transducer comprises solely a set of parallel electrode arrays for tuneable Lamb wave detection or generation. In a further embodiment, the transducer comprises solely a set of divergent electrode arrays for tuneable Lamb wave detection or generation. As will be understood by those skilled in the art, parallel electrode arrays are more power efficient than divergent electrode arrays but have smaller physical coverage, while divergent electrode arrays consume more power but have greater physical coverage. In another embodiment, the transducer comprises only electrode arrays in the form of the third and fourth electrode arrays as described above.

In another embodiment, the transducer itself may be used in a setup procedure to determine the required tuning frequency, without the need to compute theoretical dispersion curves. For example, the transducer may be attached to its working surface and then stimulated using the guided Lamb wave technique. The resulting signals generated by the transducer are then analysed using classical techniques, such as Two Dimensional Fast Fourier Transform (2D FFT) techniques, to determine the dispersion curves including Lamb wave mode amplitudes, thus enabling the selection of the transducer frequency for operational detection of a given wave mode. Each array in the transducer may be used for determining dispersion curves in its respective direction and physical location within the transducer footprint. Typically, 32 transducer elements 301 are used to provide results. However, by using the arrays on either side of the elements 503 and 504, the number of elements in array 301 may be reduced to 16. Alternatively, keeping the number of elements in array 301 as it is (32) will improve the dispersion curve data accuracy.

In a further embodiment, divergent arrays are used for power harvesting from low frequency structural vibration such as aerodynamic or engine vibration/noise. In another embodiment, an array of such power harvesting sensors are arranged to pass power wirelessly between each other from a single power source. The power source may be a sensor itself. In another embodiment, the transducers are used to harvest power from high frequency vibration thus enabling a given powered transducer to wirelessly provide power to surrounding transducers via Lamb waves.

In a further embodiment, divergent or parallel electrode arrays are used to transmit data encoded in Lamb waves so as to provide communication between sensors. Such communications may transport data across a network of such sensors or may be used for passing control messages between sensors. In another embodiment, the parallel or divergent electrode arrays are used to produce advanced or complex Lamb waves arranged to perform high sensitivity or complexity acoustic damage location.

In the present embodiments, the transducers comprise first and second radial electrode arrays having thirty electrode elements or third central electrode arrays comprising three elements. As will be understood by those skilled in the art, fewer elements will reduce the possible frequency resolution of the electrode array while a greater number of electrode elements will increase the possible frequency resolution of the electrode array. Similarly more closely spaced or radially narrower electrode elements will increase the possible frequency resolution of the electrode array while greater spaced or radially thicker electrode elements will decrease the possible frequency resolution of the electrode array. Embodiments of the invention may be provided with arrays of different element dimensions or separations thus providing the transducer with a plurality of array with different frequency or wavelength ranges and resolutions. Arrays may be provided with non-uniform electrode element sizes or separations so as to provide non-linear frequency resolution over the given range.

As will be understood by those skilled in the art, the overall size of a transducer is governed by a number of factors. The largest distance between elements is governed by the half wavelength of the largest wavelength of the Lamb wave mode that is required to be excluded or filtered out from detection or generation. In addition, that distance is also optimally equal to a multiple of the wavelength of the Lamb wave mode that is required to be detected or generated.

As will be understood by those skilled in the art, the transducers may be arranged in any suitable pattern over the structure to which they are applied. Furthermore, any combination of transducers having different capabilities as described above may be used in cooperative combination depending on their application. For example, a combination of one transmitting transducer with one or more receiving transducers may be suited to some applications. Also, the transducer need not be circular but may be arranged in any suitable format for providing the desired frequency range and resolution and directionality.

As will be understood by those skilled in the art, while embodiments of the invention described above illustrate the invention applied to a primary structural elements of an aircraft in the form of an aircraft fuselage, the invention is equally applicable to other elements of an aircraft such as secondary structures in the form of doors, engines, control surfaces or landing gear.

As will be understood by those skilled in the art, the manufacture of the sensor may use any number of suitable techniques such as photolithography or functional printing. As will be understood by those skilled in the art, the sensor may be formed from any suitable piezoelectric material such as PZT, Polyvinylidene Fluoride (PVDF) and may be formed of composite layers or be of a pillar type piezoelectric. As will be understood by those skilled in the art, the radial position of the electrode arrays may be arranged to coincide with fibre orientation in a structure comprising composite material.

As will be understood by those skilled in the art that the apparatus that embodies a part or all of the present invention may be a general purpose device having software arranged to provide a part or all of an embodiment of the invention. The device could be a single device or a group of devices and the software could be a single program or a set of programs. Furthermore, any or all of the software used to implement the invention can be communicated via any suitable transmission or storage means so that the software can be loaded onto one or more devices.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

The invention claimed is:

1. An acoustic transducer comprising:

a piezoelectric substrate having a first and second opposing sides;

a common electrode disposed on said first side of said substrate;

a plurality of first electrode arrays each comprising a plurality of independent electrode elements disposed on said second side of said substrate, each of said plurality of independent electrode elements being circumferentially disposed and radially spaced relative to a nominal centre point and arranged to enable one or more groups of said electrode elements to be selected from a given first electrode array so as to tune said first electrode array to a predetermined frequency band, and each said first electrode array being arranged in a predetermined radial direction relative to said nominal centre point so as to tune each first electrode array to signals having a corresponding directionality.

2. An acoustic transducer according to claim 1 in which said first electrode arrays are arranged to enable one or more groups of said electrode elements to be selected from a given first electrode array so as to tune said given first electrode array to a predetermined frequency band and to determine the position of said groups relative to said nominal centre point.

3. An acoustic transducer according to claim 1 in which said electrode elements for one or more of said first electrode array are arranged with a common circumferential dimension.

4. An acoustic transducer according to claim 1 in which said electrode elements for one or more of said first electrode array are arranged with a circumferential dimension proportional to the distance of a given electrode element from said nominal centre point.

5. An acoustic transducer according to claim 1 in which said transducer further comprises a circumferentially disposed second array of radially disposed electrode elements.

6. An acoustic transducer according to claim 1 in which said transducer further comprises a third array centred on said nominal centre point.

7. An acoustic transducer according to claim 6 in which said third array comprises one or more radially spaced concentric elements.

8. An acoustic transducer according to claim 1 in which said transducer is arranged to operate at a frequency range of 10 kHz to 20 Mhz.

9. An acoustic transducer according to claim 1 in which said each electrode element is wired to processor for processing signal received by said transducer.

10. An acoustic transducer according to claim 1 in which said transducer is arranged for use with guided Lamb waves.

11. An acoustic transducer according to claim 1, wherein said piezoelectric substrate is a planar.

12. An acoustic transducer according to claim 1, wherein said piezoelectric substrate is a wafer.

13. An acoustic transducer according to claim 1, wherein said piezoelectric substrate is a lead zirconate titanate (PZT) wafer.

14. An acoustic monitoring system, comprising:

an acoustic transducer comprising:

a piezoelectric substrate having a first and second opposing sides;

a common electrode disposed on said first side of said substrate;

a plurality of first electrode arrays each comprising a plurality of independent electrode elements disposed on said second side of said substrate, each of said plurality of independent electrode elements being circumferentially disposed and radially spaced relative to a nominal centre point and arranged to enable one or more groups of said electrode elements to be selected from a given first electrode array so as to tune said first electrode array to a predetermined frequency band, and each said first electrode array being arranged in a predetermined radial direction relative to said nominal centre point so as to tune each first electrode array to signals having a corresponding directionality.

* * * * *